United States Patent
Ramos et al.

(10) Patent No.: US 6,559,071 B2
(45) Date of Patent: May 6, 2003

(54) PROCESS FOR PRODUCING DIELECTRIC THIN FILMS

(75) Inventors: Teresa Ramos, Albuquerque, NM (US); Douglas M. Smith, Albuquerque, NM (US); James Drage, Fremont, CA (US); Rick Roberts, Mountain View, CA (US)

(73) Assignee: AlliedSignal Inc., Morristown, NJ (US)

( * ) Notice: Subject to any disclaimer, the term of this patent is extended or adjusted under 35 U.S.C. 154(b) by 0 days.

(21) Appl. No.: 10/145,935

(22) Filed: Oct. 26, 2001

(65) Prior Publication Data
US 2002/0173168 A1 Nov. 21, 2002

Related U.S. Application Data

(62) Division of application No. 09/379,866, filed on Aug. 24, 1999, now Pat. No. 6,372,666.
(60) Provisional application No. 60/098,515, filed on Aug. 31, 1998.

(51) Int. Cl.$^7$ .............................................. H01L 21/469
(52) U.S. Cl. .................. 438/781; 438/758; 438/765; 438/780; 438/789; 438/790; 438/795
(58) Field of Search ................................ 438/758, 765, 438/786, 781, 782, 789, 790, 795

(56) References Cited

U.S. PATENT DOCUMENTS

| | | | | |
|---|---|---|---|---|
| 5,226,056 A | * | 7/1993 | Kikuchi et al. | 156/345.34 |
| 5,314,724 A | | 5/1994 | Tsukune et al. | 427/489 |
| 5,496,402 A | | 3/1996 | Sakamoto et al. | 106/287.16 |
| 5,736,425 A | | 4/1998 | Smith et al. | 438/778 |
| 5,847,443 A | * | 12/1998 | Cho et al. | 438/763 |

FOREIGN PATENT DOCUMENTS

| | | |
|---|---|---|
| EP | 0 688 052 A2 | 12/1995 |
| EP | 0 775 669 A2 | 5/1997 |
| JP | 54-158445 | * 12/1979 ......... H01L/21/302 |

OTHER PUBLICATIONS

A. Venkateswara Rao, et al. "Effect of Glycerol on Monolithicity, Density, Microhardness and Sintering Temperature of TMOS Silica Aerogels", Microporous Materials 12 (1997) 63–69.

A. Venkateswara Rao, et al. "Preparation and Characterization of Hydrophobic Silica Aerogels", Materials Chemistry and Physics 53, (1998) 13–18.

Hajime Tamon, et al. "Control of Mesoporous Structure of Silica Aerogel Prepared from TMOS", L of Colloid and Interface Science 188, 162–167 (1997).

Hajime Tamon, et al. "Preparation of Silica Aerogel from TEOS", L of Colloid and Interface Science 153–154 (1998).

Param H. Tewari, et al. "Microstructural Studies of Transparent Silica Gels and Aerogels", Mat. Res. Soc. Symp. Proc. vol. 73 (1998) Materials Research Society.

* cited by examiner

Primary Examiner—Kamand Cuneo
Assistant Examiner—Lisa Kilday
(74) Attorney, Agent, or Firm—Roberts & Mercanti, LLP

(57) ABSTRACT

A process for forming a nanoporous silica dielectric coating on a substrate. A substrate containing a deposited film is suspended within a sealable hotplate, while remaining free of contact with the hotplate. The hotplate is sealed and an inert gas is flowed across the substrate. The hotplate is heated to a temperature of from about 350° C. or higher, and the substrate is forced to contact the heated hotplate. The substrate is heated for a time that sufficiently removes outgassing remnants from the resultant nanoporous dielectric coating.

21 Claims, 1 Drawing Sheet

PROCESS FOR PRODUCING DIELECTRIC THIN FILMS

CROSS REFERENCE TO RELATED APPLICATION

This application is a division of U.S. patent application Ser. No. 09/379,866 now U.S. Pat. No. 6,372,666 filed Aug. 24, 1999, which claims the benefit of provisional patent application serial No. 60/098,515 filed Aug. 31, 1998.

BACKGROUND OF THE INVENTION

1. Field of the Invention

The invention relates to dielectric films, more particularly nanoporous dielectric films, and to a process for their manufacture. The nanoporous dielectric films provide low dielectric constants. Such films are useful in the production of integrated circuits.

2. Description of the Prior Art

In the production of advanced integrated circuits that have minimum feature sizes of 0.25 micrometers and below, problems of interconnect RC delay, power consumption and crosstalk become significant. The use of low dielectric constant (K) materials for interlevel dielectric and intermetal dielectric applications partially mitigate these problems. However, each of the material candidates which are under consideration by the industry, having dielectric constants significantly lower than the currently employed dense silica, suffer from disadvantages. Most low dielectric constant materials developments use spin-on-glasses and fluorinated plasma chemical vapor deposition $SiO_2$ with K of greater than 3. Some organic and inorganic polymers have dielectric constants in the range of about 2.2 to 3.5, however, these have the problems of low thermal stability, poor mechanical properties including low glass transition temperature, sample outgassing, and long term reliability questions.

Another approach has been to employ nanoporous silica which can have dielectric constants in the range of about 1 to 3. Porous silica is attractive because it employs similar precursors, e.g. tetraethoxysilane (TEOS) as is presently used for spin-on glass (SOG's) and CVD $SiO_2$, and due to the ability to carefully control pore size and pore distribution. In addition to having low dielectric constants, nanoporous silica offers other advantages for microelectronics including thermal stability up to 900° C.; small pore size (<<microelectronics features), use of materials, namely silica and its precursors, that are widely used in the semiconductor industry; the ability to tune dielectric constant over a wide range; and deposition using similar tools as employed for conventional spin-on glass processing. EP patent application EP 0 775 669 A2, which is incorporated herein by reference, shows one method for producing a nanoporous silica film with uniform density throughout the film thickness.

Higher porosity materials not only leads to a lower dielectric constant than dense materials, but such also allow additional components and processing steps to be introduced. Materials issues include, the need for having all pores significantly smaller than circuit feature sizes; the strength decrease associated with porosity; and the role of surface chemistry on dielectric constant, loss and environmental stability. Density, or its inverse, porosity, is the key nanoporous silica parameter controlling property of importance for dielectrics. Properties may be varied over a continuous spectrum from the extremes of an air gap at a porosity of 100% to dense silica with a porosity of 0%. As density increases, dielectric constant, hardness and mechanical strength increase but the pore size decreases.

Nanoporous silica films are fabricated by using a mixture of a solvent and a silica precursor which is deposited on a wafer by conventional methods such as spin-coating, dip-coating, etc. The precursor must polymerize after deposition and be sufficiently strong such that it does not shrink during drying. Film thickness and density/dielectric constant can be controlled independently by using a mixture of two solvents with different volatility. The more volatile solvent evaporates during and immediately after precursor deposition, while the less volatile solvent remains as the pore fluid. The silica precursor, typically a partially hydrolyzed and condensed product of TEOS, is polymerized by chemical and/or thermal means until it forms a gel layer. Using this approach, a nanoporous silica film is obtained with uniform density throughout the film thickness.

Normally in sol-gel processing to produce porous silica, a liquid catalyst such as an acid or base is added to the silica precursor/solvent mixture in order to initiate polymerization. This catalyst addition is often accompanied by the addition of water which is a reactant in the silane hydrolysis and condensation reactions which result in polymerization.

In semiconductor processing, film curing is an essential step to allow the film to reach thermal equilibrium. Often times the thermal budget for back end of the line integration processing (i.e. metallization) is different than that of the temperature needs to form low dielectric constant (K) insulating layers, therefore it is essential that the low K film be exposed to the highest temperature it will see during integration processing to prevent remnant outgassing. Outgassing of the film will damage the device structures and decrease processing yield. Wafer curing via a high temperature hotplate could have beneficial effects in terms of improving the mechanical properties of the nanoporous silica thinfilm. A high temperature hotplate could increase the extent of crosslinking which would directly improve the mechanical integrity of the film. In addition to mechanical properties, high temperature hotplates could improve the wafer throughput due to the short processing times. Conventional SOG's are typically cured via a horizontal tube furnace. The time required to reach thermal equilibrium is on the order of 30 minutes with a ramp up and a ramp down time period which more than doubles the over-all processing time.

In conventional wafer curing or drying of low K nanoporous dielectric films, SOGs routinely requires 30 minutes of elevated temperature exposure time. Ramp up and ramp down time for thermal equilibrium more than doubles the exposure time. Thermal equilibrium is needed to expose the films to the highest temperature during integration to prevent remnant outgassing. Wafer curing may have adverse effects on film hardness and mechanical strength.

The present invention solves these problems by conducting a series of processing steps which enable the production of nanoporous silica thin films with minimum process time and more consistent uniformity of film thickness.

SUMMARY OF THE INVENTION

The invention provides a process for producing a cured dielectric film on a substrate which comprises depositing a nanoporous silica dielectric precursor onto a substrate which precursor comprises at least one hydrolysed and condensed alkoxysilane composition, and then heating the substrate in a substantially oxygen free environment at a temperature of about 350° C. or greater, for a time period of at least about 5 seconds.

The invention further provides a process for curing a dielectric film on a substrate which comprises the step of treating a suitable substrate comprising a dielectric film, in a substantially oxygen free environment by heating the substrate to a temperature of about 350° C. or greater, for a time period of at least about 5 seconds.

The invention also provides a process for curing a nanoporous silica dielectric film on a substrate which comprises the step of treating a suitable substrate comprising a dried nanoporous silica film, in a substantially oxygen free environment by heating the substrate to a temperature of about 350° C. or greater, for a time period of at least about 5 seconds.

The invention also provides a process for curing a nanoporous silica dielectric film on a substrate which comprises the steps of (a) suspending a suitable substrate within a heating element, in a substantially oxygen free environment, wherein the substrate remains free of contact with the heating element, the substrate comprising a dried nanoporous silica film; (b) curing the dried nanoporous silica film sufficiently to remove outgassing remnants from the dried nanoporous silica film; then, (c) removing the cured, dried suitable substrate from the heating element.

The invention further provides a process for curing a nanoporous silica dielectric film on a substrate which comprises the steps of (a) suspending a suitable substrate within a sealable hotplate, wherein the substrate remains free of contact with the hotplate, wherein the substrate comprises a dried nanoporous silica film; (b) sealing the hotplate, wherein the suspended substrate is contained therein; (c) passing an amount of inert gas across the substrate effective to displace non-inert gases adjacent to the substrate; (d) heating the hotplate to a temperature of from about 350° C. to about 600° C.; (e) contacting the substrate with the heated hotplate; and, (f) removing the substrate from the hotplate.

Additionally, the invention provides a process for curing a nanoporous silica dielectric film on a substrate which comprises the steps of (a) suspending a suitable substrate within a sealable hotplate, wherein the substrate remains free of contact with the hotplate, wherein the substrate comprises a dried nanoporous silica film; (b) sealing the hotplate, wherein the suspended substrate is contained therein; (c) drawing a vacuum within the hotplate effective to create a substantially oxygen free environment adjacent to the substrate; (d) heating the hotplate to a temperature of from about 350° C. to about 600° C.; (e) contacting the substrate with the heated hotplate; and, (f) removing the substrate from the hotplate.

By means of this invention, the dielectric constant of the nanoporous silica dielectric coating on a substrate achieves a low dielectric constant (K) below 3, while maintaining improved hardness and mechanical strength. Remnant outgassing is minimized with rapid curing periods that significantly increase film production rates.

DETAILED DESCRIPTION OF THE PREFERRED EMBODIMENT

Figure 1:
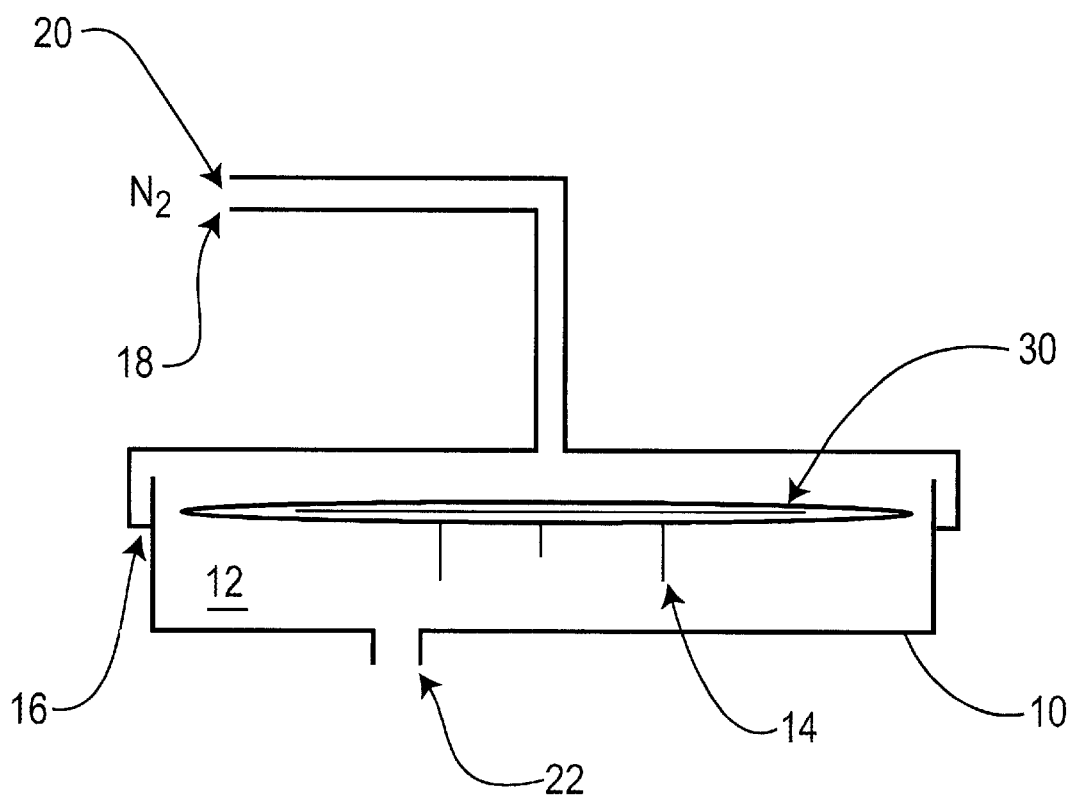
FIG. 1 is a diagram of the preferred embodiment having a substrate with a dried film thereon processed in a hotplate according to this invention.

The present invention is used in the production of advanced integrated circuits, preferably with integrated circuits having reduced minimum feature sizes, more preferably having minimum features sizes of from about 0.25 micrometers and below, and most preferably having minimum features sizes of from about 0.18 micrometers and below. A film on a substrate possesses dielectric properties through an improved curing process of the film. Preferably the dielectric film comprises a nanoporous dielectric coating, which more preferably is a spin-on film. This includes curing the film in a substantially oxygen free environment, such as by enveloping the wafer containing the film in an inert gas, and heating the enveloped wafer to an elevated temperature of from about 350° C. or greater for a time period of greater than about 5 seconds.

Fabrication of the Dried Nanoporous Silica Film

In the practice of the present invention, a suitable substrate has been formed. The suitable substrate comprises a dried nanoporous silica film which has been deposited or placed on a substrate. Generally, the substrate is a silicon wafer substrate that is suitable to be processed into an integrated circuit or other microelectronic device. Suitable substrates for the present invention non-exclusively include semiconductor materials such as gallium arsenide (GaAs), silicon and compositions containing silicon such as crystalline silicon, polysilicon, amorphous silicon, epitaxial silicon, and silicon dioxide ($SiO_2$), germanium and mixtures thereof. Lines, when present, are typically formed by well known lithographic techniques and may be composed of a metal, an oxide, a nitride or an oxynitride. Suitable materials for the lines include silica, silicon nitride, titanium nitride, tantalum nitride, aluminum, aluminum alloys, copper, copper alloys, tantalum, tungsten and silicon oxynitride. These lines form the conductors or insulators of an integrated circuit. Such are typically closely separated from one another at distances of about 20 micrometers or less, preferably 1 micrometer or less, and more preferably from about 0.05 to about 1 micrometer.

A liquid dielectric layer, preferably a spin-on glass in a suitable solvent is applied to the substrate surface under ambient conditions. The dielectric layer may comprise a silsesquioxane polymer, a siloxane polymer, a poly(arylene ether), a fluorinated poly(arylene ether), polymeric dielectric materials or mixtures thereof. Polymeric dielectric materials useful for the invention include hydrogensiloxanes which have the formula $[(HSiO_{1.5})_xO_y]_n$, hydrogensilsesquioxanes which have the formula $(HSiO_{1.5})_n$, and hydroorganosiloxanes which have the formulae $[(HSiO_{1.5})_xO_y(RSiO_{1.5})_z]_n$, $[(HSiO_{1.5})_x(RSiO_{1.5})_y]_n$ and $[(HSiO_{1.5})_xO_y(RSiO_{1.5})_z]_n$. In each of these polymer formulae, x=about 6 to about 20, y=1 to about 3, z=about 6 to about 20, n=1 to about 4,000, and each R is independently H, $C_1$, to $C_8$ alkyl or $C_6$ to $C_{12}$ aryl. The weight average molecular weight may range from about 1,000 to about 220,000. In the preferred embodiment n ranges from about 100 to about 800 yielding a molecular weight of from about 5,000 to about 45,000. More preferably, n ranges from about 250 to about 650 yielding a molecular weight of from about 14,000 to about 36,000. Useful polymers within the context of this invention non-exclusively include hydrogensiloxane, hydrogensilsesquioxane, hydrogenmethylsiloxane, hydrogenethylsiloxane, hydrogenpropylsiloxane, hydrogenbutylsiloxane, hydrogentert-butylsiloxane, hydrogenphenylsiloxane, hydrogenmethylsilsesquioxane, hydrogenethylsilsesquioxane, hydrogenpropylsilsesquioxane, hydrogenbutylsilsesquioxane, hydrogentert-butylsilsesquioxane and hydrogenphenylsilsesquioxane and mixtures thereof. Useful organic polymers include polyimides, fluorinated and nonfluorinated polymers, in particular fluorinated and nonfluorinated poly(arylethers) available under the tradename FLARE™ from AlliedSignal Inc., and copolymer mixtures thereof The hydroorganosiloxanes, poly(arylene ethers), fluorinated poly (arylene ethers) and mixtures thereof are preferred. Preferred siloxane materials suitable for use in this invention are commercially available from AlliedSignal Inc. under the tradename Accuglass®. The polymer component is preferably present in an amount of from about 10% to about 50% by weight of the composition. A more preferred range is from about 15% to about 30% and most preferably from about 17% to about 25% by weight of the composition.

Typically, a nanoporous silica wet gel film is prepared using a mixture of at least one solvent and a silica precursor. The mixture is deposited on a silicon wafer substrate suitable for producing an integrated circuit, by conventional methods such as spin-coating and dip-coating, and/or sol-gel techniques. A solvent composition having multiple solvents, preferably two solvents, with different volatilities may be used. Film thickness and density/dielectric constant may be independently controlled by using a mixture of two solvents with distinct volatilities. The more volatile solvent evaporates during and immediately after precursor deposition. The silica precursor is applied to the substrate and polymerized by chemical and/or thermal means until it forms a gel. Typically, the silica component of the nanoporous silica film may comprise any silica material known in the art, including alkoxysilanes such as tetraethoxysilane (TEOS) and tetramethoxysilane.

Preferably the solvent composition comprises at least one a relatively high volatility solvent and at least one a relatively low volatility solvent. The high volatility solvent evaporates during and immediately after deposition of the silica film. A relatively high volatility solvent is one which evaporates at a temperature below, preferably significantly below that of the relatively low volatility solvent. The relatively high volatility solvent preferably has a boiling point of about 120° C. or less, preferably about 100° C. or less. Suitable high volatility solvents nonexclusively include methanol, ethanol, n-propanol, isopropanol, n-butanol and mixtures thereof. Other relatively high volatility solvent compositions which are compatible with the other ingredients can be readily determined by those skilled in the art. Once applied on the substrate, the higher volatility solvent of the nanoporous silica wet gel film is then at least partially evaporated over a period of seconds or minutes. Slightly elevated temperatures may optionally be employed to accelerate this step. Typical temperatures may range from about 20° C. to about 80° C., preferably range from about 20° C. to about 50° C. and more range from about 20° C. to about 35° C. With the evaporation of the higher volatility solvent, the film is a viscous liquid of the silica precursors and the less volatile solvent, forming the dried nanoporous silica film.

The relatively low volatility solvent composition is one which evaporates at a temperature above, preferably significantly above that of the relatively high volatility solvent. The relatively low volatility solvent composition preferably has a boiling point of about 175° C. or higher, more preferably about 200° C. or higher. Suitable low volatility solvent compositions nonexclusively include alcohols and polyols including glycols such as ethylene glycol, 1,4-butylene glycol, 1,5-pentanediol, 1,2,4-butanetriol, 1,2,3-butanetriol, 2-methyl-propanetriol, 2-(hydroxymethyl)-1,3-propanediol, 1,4-butanediol, 2-methyl-1,3-propanediol, tetraethylene glycol, triethylene glycol monomethyl ether, glycerol and mixtures thereof. Other relatively low volatility solvent compositions which are compatible with the other ingredients can be readily determined by those skilled in the art. With the removal of the low volatility solvent, the density/dielectric constant of the final film is fixed by the volume ratio of low volatility solvent to silica.

The fabrication of the dried nanoporous silica film on the appropriate substrate, described above, provides a suitable substrate. A number of methods for the preparation of the suitable substrate comprising a nanoporous silica film on the substrate base are known to the art. Such substrates optionally have raised lines on the surface receiving the nanoporous film and preferably are suitable for the production of integrated circuits, e.g., with optional electronic elements and conduction pathways placed under, over and/or adjacent to the nanoporous film, in addition, a number of variations and improvements to these generally known methods for the preparation of nanoporous films are taught by co-owned U.S. patent application Ser. Nos., 09/046,473 and 09/046,474, both filed on Mar. 25, 1998; U.S. patent application Ser. No. 09/054,262, filed on Apr. 3, 1998; U.S. patent application Ser. Nos. 09/111,081; 09/111,082; 09/111,083 and 09/111,084 filed Jul. 7, 1998; U.S. provisional patent application serial No. 60/095,573 filed Aug. 6, 1998; U.S. provisional patent application serial No. 60/098,068 filed Aug. 27, 1998; U.S. patent application Ser. Nos. 09/140,855 and 09/141,287 filed Aug. 27, 1998; U.S. provisional patent application serial No. 60/098,515 filed Aug. 31, 1998; U.S. patent application Ser. No. 09/234,609 filed Jan. 21, 1999; U.S. patent application Ser. No. 09/235,186 filed Jan. 22, 1999; U.S. patent application Ser. Nos. 09/291,510 and 09/291,511 filed Apr. 14, 1999; U.S. provisional patent application serial No. 60/117,248 filed Jan. 26, 1999; and U.S. patent application Ser. No. 09/360,131 filed Jul. 23, 1999, the disclosures of which are incorporated herein by reference. Other dielectrics are taught in U.S. patent application Ser. Nos. 09/055,244 and 09/055,516, both filed on Apr. 6, 1998, and U.S. patent application Ser. No. 08/955,802, filed on Oct. 22, 1997, the disclosures of which are incorporated by herein by reference.

The applied film component of the suitable substrate is further dried and cured on the substrate in a manner consistent with the present invention, described below.

Curing of the Dried Nanoporous Silica Film

Curing the suitable substrate includes treating the film in an oxygen free environment by heating the enveloped treated substrate to an elevated temperature of from about 350° C. or greater for a time period of greater than about 5 seconds. In a more preferred embodiment, the substrate is suspended within a heating element, such as a furnace, convection oven, hotplate or lamp which serves as a source of heat, while it remains free of contact with the heating element. An oxygen free environment is maintained by forcing an inert gas into the area around the substrate, which envelopes the suspended substrate in a non-reactive environment. The heating element is used to heat the substrate sufficiently to dry the film. After drying, the dried substrate is then removed from the heating element. In the most preferred embodiment, the heating element comprises a sealable hotplate that seals the substrate in a controllable environment within the hotplate. An inert gas is used to displace non-inert gases adjacent to the substrate prior to heating. The hotplate is heated to an appropriate temperature for drying the film, and the substrate is forced to be in contact with the heated hotplate, which dries the film.

A non-reactive, or substantially oxygen free, environment is maintained adjacent to the substrate to be treated. This non-reactive environment may be either an inert gas and/or vacuum that is placed along and against the sides of the substrate, that accordingly envelops or surrounds the film as well. This may be done by forcing a flow of an inert gas over the substrate to be treated in an amount and at a sufficient flow rate to displace oxygen adjacent to the substrate, which leaves the environment adjacent to the substrate substantially oxygen free. In another embodiment, a vacuum may be drawn around the substrate, which also creates a substantially oxygen free environment adjacent to the substrate. Additionally, the sequential use of an inert gas in combination with drawing a vacuum may be used. As such, an inert gas may be passed adjacent to the substrate, followed by drawing a vacuum, in a manner to facilitate the creation of a substantially oxygen free environment. Thus, it will be appreciated that oxygen concentrations around the substrate to be treated are preferably maintained at a concentration that does not interfere and/or prevents oxidation of the film on the substrate. Preferably the oxygen concentration adjacent to the substrate to be treated e.g., by curing, is from about 20 ppm or less, more preferably from about 10 ppm or less, and most preferably from about 5 ppm or less. Exemplary inert gases include nitrogen, argon, and other like gases, including combinations thereof. The non-reactive environment adjacent to the substrate may be maintained at from about 1 atmosphere to about 1.5 atmosphere, when using inert gases. Using vacuum conditions, the environment is sufficiently evacuated to remove oxygen for the purpose of drying, preferably from about 0.001 atmosphere to about 0.5 atmosphere, more preferably from about 0.001 to about 0.3 atmosphere, and most preferably from about 0.001 atmosphere to about 0.2 atmosphere. The optimum amount of adjacent environmental ambient pressure for oxygen removal is determinable by those skilled in the art. Optionally the entire coating and curing process can be done while enveloped in an inert gas in a conventional cluster tool without breaking vacuum.

The heating element may be any temperature controllable device known by those skilled in the art suitable to proper heating of the substrate. This includes, but is not limited to, combustion, electrical, radiant, and/or other such devices. Preferably the heating element includes a furnace, convection oven or hotplate, more preferably a hotplate, and most preferably an electrical hotplate. Preferably, the hotplate is heated to a temperature of from about 350° C. or greater, more preferably from about 350° C. to about 600° C., still more preferably from about 400° C. to about 500° C., and most preferably from about 425° C. to about 450° C. The substrate is heated for a time that sufficiently removes outgassing remnants from the resultant nanoporous dielectric coating. Preferably, the substrate is heated for a time period of greater than about 5 seconds, and more preferably from about 1 minute or more. When the substrate is not placed in contact with a heating element, the heating preferably extends from about 1 minute to about 120 minutes, and more preferably from about 30 minutes to about 60 minutes. When the substrate is placed in contact with the hotplate, the heating preferably extends for a time period of from about 1 minute to about 2 minutes, more preferably from about 1 minute to about 1.5 minutes, and most preferably from about 1 minute to about 1.1 minutes.

As seen in FIG. 1, in the preferred embodiment of the substrate 30 being placed in contact with the sealable hotplate 10, the hotplate 10 is pre-heated to a temperature of about 400° C. The substrate 30 is placed in a chamber 12 within the hotplate 10 on ceramic pins 14, and the hotplate 10 is closed with an airtight seal 16. Nitrogen 20 is flowed into the hotplate chamber 12 through an inlet 18 at approximately 60 liters per minute for thirty seconds. The nitrogen 20 flowing into the chamber 12 displaces oxygen within the chamber 12 that is adjacent to the substrate 30, with the oxygen exiting from the sealed hotplate 10 through an outlet 22 having a pressure sensitive one-way valve. The substrate 30 is dropped from the pins directly onto the hotplate 10, where it remains for 1 minute. The hotplate 10 is opened, and the substrate 30 is removed from the chamber 12 inside of the hotplate 10.

Direct contact of the substrate 30 with the hotplate 10 causes a rapid drying of the wet gel film. The inert gas environment adjacent to the substrate 30 allows the drying to occur without contaminating the film. The resulting rapid process allows increased efficiency in the production of a nanoporous dielectric coating formed on a substrate.

The substrate produced by the inventive processes has a relatively high porosity, low dielectric constant, silicon containing polymer composition formed thereon. The silicon containing polymer composition preferably has a dielectric constant of from about 1 to about 3, more preferably from about 1.1 to about 2.5, and most preferably from about 1.3 to about 2.0. The pore size of the resulting nanoporous silica composition ranges from about 1 nm to about 100 nm, more preferably from about 2 nm to about 30 nm, and most preferably from about 3 nm to about 20 nm. The density of the silicon containing composition, including the pores, ranges from about 0.1 to about 1.9 $g/cm^3$, more preferably from about 0.25 to about 1.6 $g/cm^3$, and most preferably from about 0.4 to about 1.2 $g/cm^3$. Determination of the effectiveness of the produced nanoporous silica films is performed by ellipsometry, infrared spectra (IR) measurements, and dielectric constant measurements.

The following nonlimiting examples serve to illustrate the invention.

EXAMPLE 1

This example illustrates the use of a high temperature hotplate set at 400° C. yielding excellent nanoporous silica film qualities when fully characterized. The precursor is synthesized by adding 104.0 mL of tetraethoxysilane, manufactured by Pacific Pac of Hollister, Calif., 47.0 mL of triethylene glycol monomethyl ether, manufactured by Pacific Pac of Hollister, Calif., 8.4 mL of deionized water, and 0.34 mL of IN nitric acid, manufactured by J. T. Baker of Phillipsburg, N.J., together in a round bottom flask. The solution is mixed vigorously, then heated to ~80° C. and refluxed for 1.5 hours to form a solution. After the solution is allowed to cool, it is diluted 25% by weight with ethanol, manufactured by Ricca Chemical Company of Arlington, Tex., to reduce the solution viscosity. The diluted precursor is filtered to 0.1 µm using a teflon filter. Approximately 8.0–10.0 ml of the precursor is deposited onto 8" inch silicon wafers on a spin chuck, and spun at 2500 rpm for 30 seconds. The film is gelled and aged in a vacuum chamber by evacuating the chamber to −20"Hg, then 15M ammonium hydroxide, manufactured by Aldrich Chemical Company of Milwaukee, Wis., is heated and equilibrated at 45° C. and dosed into the chamber to increase the pressure to −4.0 "Hg for 2–3 minutes. The chamber is then evacuated to −20.0 "Hg and backfilled with nitrogen. The film is then solvent exchanged by which 20–30 mL of a 50/50 by volume mixture of acetone, manufactured by Pacific Pac of Hollister, Calif., and hexamethyldisilazane, manufactured by Pacific Pac of Hollister, Calif., are spun on the film at 250 rpm's for 20 seconds without allowing the film to dry. The films are then spun dry at 1000 rpm for 5 seconds. The films are heated at elevated temperatures for 1 minute each at 175° C. and 320° C. in air.

The film is then placed in a high temperature hotplate that had been pre-equilibrated to 400° C. The process for the film placement includes opening the high temperature hotplate and placing the wafer on ceramic pins within the hotplate. The process further includes closing the hotplate such that it is air tight, and flowing nitrogen at 60 liters per minute for thirty seconds, thereby removing most of the oxygen in the hotplate to an oxygen content of less than 10 ppm. The process then includes dropping the wafer from the pins directly onto the hotplate which is equilibrated at 400° C., and processing the wafer within the hotplate for 1 minute and then removing the wafer from the hotplate.

EXAMPLE 2

This example illustrates the use of a high temperature hotplate set at 450° C. yielding excellent nanoporous silica film qualities when fully characterized. Preparation of the precursor and wafer prior to placement into the hotplate is performed as described in Example 1. The film is then placed in a high temperature hotplate that had been pre-equilibrated to 450° C. The process for the film placement includes opening the high temperature hotplate and placing the wafer on ceramic pins within the hotplate. The process further includes closing the hotplate such that it is air tight, and flowing nitrogen at 60 liters per minute for forty seconds, thereby removing most of the oxygen in the sealed hotplate. The process then includes dropping the wafer from the pins directly onto the hotplate which is equilibrated at 450° C., and processing the wafer within the hotplate for 1 minute and then removing the wafer from the hotplate.

EXAMPLE 3

This example illustrates the use of a high temperature hotplate set at 350 ° C. yielding excellent nanoporous silica film qualities when fully characterized. Preparation of the precursor and wafer prior to placement into the hotplate is performed as described in Example 1. The film is then placed in a high temperature hotplate that had been pre-equilibrated to 350° C. The process for the film placement includes opening the high temperature hotplate and placing the wafer on ceramic pins within the hotplate. The process further includes closing the hotplate such that it is air tight, and flowing nitrogen at 60 liters per minute for one minute, thereby removing most of the oxygen in the sealed hotplate. The process then includes dropping the wafer from the pins directly onto the hotplate which is equilibrated at 350° C., and processing the wafer within the hotplate for 1 minute and then removing the wafer from the hotplate.

EXAMPLE 4

This example illustrates the use of a high temperature hotplate set at 600° C. yielding excellent nanoporous silica film qualities when fully characterized. Preparation of the precursor and wafer prior to placement into the hotplate is performed as described in Example 1. The film is then placed in a high temperature hotplate that had been pre-equilibrated to 600° C. The process for the film placement includes opening the high temperature hotplate and placing the wafer on ceramic pins within the hotplate. The process further includes closing the hotplate such that it is air tight, and flowing nitrogen at 60 liters per minute for thirty seconds, thereby removing most of the oxygen in the sealed hotplate. The process then includes dropping the wafer from the pins directly onto the hotplate which is equilibrated at 600° C., and processing the wafer within the hotplate for 1 minute and then removing the wafer from the hotplate.

EXAMPLE 5

This example illustrates the use of a high temperature hotplate set at 425° C. yielding excellent nanoporous silica film qualities when fully characterized. Preparation of the precursor and wafer prior to placement into the hotplate is performed as described in Example 1. The film is then placed in a high temperature hotplate that had been pre-equilibrated to 425° C. The process for the film placement includes opening the high temperature hotplate and placing the wafer on ceramic pins within the hotplate. The process further includes closing the hotplate such that it is air tight, and flowing nitrogen at 60 liters per minute for thirty seconds, thereby removing most of the oxygen in the sealed hotplate. The process then includes dropping the wafer from the pins directly onto the hotplate which is equilibrated at 425° C., and processing the wafer within the hotplate for 1 minute and then removing the wafer from the hotplate.

EXAMPLE 6

This example illustrates the use of a high temperature hotplate set at 500° C. yielding excellent nanoporous silica film qualities when fully characterized. Preparation of the precursor and wafer prior to placement into the hotplate is performed as described in Example 1. The film is then placed in a high temperature hotplate that had been pre-equilibrated to 500° C. The process for the film placement includes opening the high temperature hotplate and placing the wafer on ceramic pins within the hotplate. The process further includes closing the hotplate such that it is air tight, and flowing nitrogen at 60 liters per minute for thirty-five seconds, thereby removing most of the oxygen in the sealed hotplate. The process then includes dropping the wafer from the pins directly onto the hotplate which is equilibrated at 500° C., and processing the wafer within the hotplate for 1 minute and then removing the wafer from the hotplate.

EXAMPLE 7

Examples 1–6 are conducted with flowing nitrogen at 65 liters per minute to remove the oxygen from inside of the sealed hotplate.

EXAMPLE 8

Examples 1–6 are conducted with flowing nitrogen at 70 liters per minute to remove the oxygen from inside of the sealed hotplate.

EXAMPLE 9

Examples 1–8 are conducted with flowing argon used instead of flowing nitrogen to remove the oxygen from inside of the sealed hotplate.

EXAMPLE 10

Examples 1–9 are conducted with processing the wafer within the hotplate for 30 seconds and then removing the wafer from the hotplate.

EXAMPLE 11

Examples 1–9 are conducted with processing the wafer within the hotplate for 2 minutes and then removing the wafer from the hotplate.

EXAMPLE 12

Examples 1–9 are conducted with processing the wafer within the hotplate for 1.5 minutes and then removing the wafer from the hotplate.

EXAMPLE 13

Examples 1–9 are conducted with processing the wafer within the hotplate for 1.1 minutes and then removing the wafer from the hotplate.

EXAMPLE 14

Examples 1–6 are conducted with the sealed hotplate evacuated to form a vacuum instead of flowing nitrogen to remove the oxygen from inside of the sealed hotplate.

EXAMPLE 15

This example illustrates the use of a high temperature furnace set at 400° C. yielding excellent nanoporous silica film qualities when fully characterized. Preparation of the precursor and wafer prior to placement into the furnace is performed as described in Example 1. The film is then placed in a high temperature furnace that had been pre-equilibrated to 400° C. The process for the film placement includes opening the high temperature furnace and placing the wafer on ceramic pins within the furnace. The process includes creating a nitrogen at one atmosphere, and processing the wafer within the furnace for 1 minute and then removing the wafer from the furnace.

EXAMPLE 16

Example 15 is conducted at a furnace temperature of 450° C.

EXAMPLE 17

Example 15 is conducted at a furnace temperature of 350° C.

EXAMPLE 18

Example 15 is conducted at a furnace temperature of 600° C.

EXAMPLE 19

Example 15 is conducted at a furnace temperature of 425° C.

EXAMPLE 20

Example 15 is conducted at a furnace temperature of 500° C.

EXAMPLE 21

Examples 15–20 are conducted with the wafer processed in the furnace for 120 minutes.

EXAMPLE 22

Examples 15–20 are conducted with the wafer processed in the furnace for 30 minutes.

EXAMPLE 23

Examples 15–20 are conducted with the wafer processed in the furnace for 60 minutes.

EXAMPLE 24

Examples 15–23 are conducted in an inert atmosphere of argon.

Analysis of Examples 1–24

After cooling, the wafers are measured by Ellipsometry for thickness and refractive index. Refractive index can be linearly correlated to the film porosity. A refractive index of 1.0 is 100% porosity and 1.46 is dense, 0% porosity silica.

EXAMPLE 25

This example illustrates that the use of a high temperature hotplate set at 400° C. can yield excellent nanoporous silica film quality when fully characterized. The precursor was synthesized by adding 104.0 mL of tetraethoxysilane, 47.0 mL of triethylene glycol monomethyl ether, 8.4 mL of deionized water, and 0.34 mL of 1N nitric acid together in a round bottom flask. The solution was allowed to mix vigorously then heated to ~80° C. and refluxed for 1.5 hours to form a solution. After the solution was allowed to cool, it was diluted 25% by weight with ethanol to reduce the viscosity. The diluted precursor was filtered to 0.1 μm using a teflon filter. Approximately 8.0–10.0 ml of the precursor was deposited onto a 8" inch silicon wafers on a spin chuck, and spun at 2500 rpm for 30 seconds. The film was placed in a flow chamber and gelled and aged using the following conditions: Ammonia gas was bubbled through 15M ammonium hydroxide at a flow rate of 3 liters per minute. The ammonia/ammonium hydroxide was then flowed through the chamber for 3 minutes. Next the film was removed. The film was then solvent exchanged by which 20–30 mL of a 5% (by vol.) mixture of methyltriacetoxysilane in 3-pentanone were spun on the film at 250 rpm's for 20 seconds without allowing the film to dry. The films were then spun dry at 1000 rpm for 5 seconds. The films were baked at elevated temperatures for 1 min. each at 175° C. and 320° C. in air. The film was then placed in a high temperature hotplate that had been pre-equilibrated to 400° C. The film was then processed in the following manner: The high temperature hotplate was opened and the wafer was placed on ceramic pins. The hotplate was closed such that that it was air tight. Nitrogen was flowed at 30 l/min. for thirty seconds to ensure that most of the oxygen in the hotplate had been removed. The wafer was dropped from the pins and heated for 5 minutes. The wafer was then lifted back on the pins and removed. The film was characterized by ellipsometry to determine the refractive index and thickness. In addition, the infrared spectra (IR) of the film was measured and compared to the post bake condition to ensure most of the water had been removed.

TABLE 1

Characterization Results of high temperature hotplates 400° C. 5 min.

| | Post Bake | Post High Temp H.P. Cure |
|---|---|---|
| Thickness (A) | 7201 | 7111.7 |
| Refractive index | 1.155 | 1.152 |
| Peak Area (3200–3565 cm-1) | 0.977 | .5724 |

EXAMPLE 26

This example illustrates that the use of a high temperature hotplate set at 400° C. can yield excellent nanoporous silica film quality when fully characterized. The precursor was synthesized by adding 104.0 mL of tetraethoxysilane, 47.0 mL of triethylene glycol monomethyl ether, 8.4 mL of deionized water, and 0.34 mL of 1N nitric acid together in a round bottom flask. The solution was allowed to mix vigorously then heated to -80° C. and refluxed for 1.5 hours to form a solution. After the solution was allowed to cool, it was diluted 25% by weight with ethanol to reduce the viscosity. The diluted precursor was filtered to 0.1 μm using a teflon filter. Approximately 8.0–10.0 ml of the precursor was deposited onto a 8" inch silicon wafers on a spin chuck, and spun at 2500 rpm for 30 seconds. The film was placed in a flow chamber and gelled and aged using the following conditions: Ammonia gas was bubbled through 15M ammonium hydroxide at a flow rate of 3 liters per minute. The ammonia/ammonium hydroxide was then flowed through the chamber for 3 minutes. Next the film was removed. The film was then solvent exchanged by which 20–30 mL of a 5% (by vol.) mixture of methyltriacetoxysilane in 3-pentanone were spun on the film at 250 rpm's for 20 seconds without allowing the film to dry. The films were then spun dry at 1000 rpm for 5 seconds. The films were baked at elevated temperatures for 1 min. each at 175° C. and 320° C. in air. The film was then placed in a high temperature hotplate that had been pre-equilibrated to 400° C. The film was then processed in the following manner: The high temperature hotplate was opened and the wafer was placed on ceramic pins. The hotplate was closed such that that it was air tight. Nitrogen was flowed at 30 l/min. for thirty seconds to ensure that most of the oxygen in the hotplate had been removed. The wafer was dropped from the pins and heated for 10 minutes. The wafer was then lifted back on the pins and removed. The film was characterized by ellipsometry to determine the refractive indicex and thickness. In addition, the infrared spectra (IR) of the film was measured and compared to the post bake condition to ensure most of the water had been removed.

TABLE 2

Characterization Results of high temperature hotplates 400° C. 10 min.

|  | Post Bake | Post High Temp H.P. Cure |
|---|---|---|
| Thickness (A) | 7201.2 | 7106.7 |
| Refractive index | 1.155 | 1.152 |
| Peak Area (3200–3565 cm-1) | 0.977 | .5666 |

EXAMPLE 27

This example illustrates that the use of a high temperature hotplate set at 450° C. can yield excellent nanoporous silica film quality when fully characterized. The precursor was synthesized by adding 104.0 mL of tetraethoxysilane, 47.0 mL of triethylene glycol monomethyl ether, 8.4 mL of deionized water, and 0.34 mL of 1N nitric acid together in a round bottom flask. The solution was allowed to mix vigorously then heated to ~80° C. and refluxed for 1.5 hours to form a solution. After the solution was allowed to cool, it was diluted 25% by weight with ethanol to reduce the viscosity. The diluted precursor was filtered to 0.1 μm using a teflon filter. Approximately 8.0–10.0 ml of the precursor was deposited onto a 8" inch silicon wafers on a spin chuck, and spun at 2500 rpm for 30 seconds. The film was placed in a flow chamber and gelled and aged using the following conditions: Ammonia gas was bubbled through 15M ammonium hydroxide at a flow rate of 3 liters per minute. The ammonia/ammonium hydroxide was then flowed through the chamber for 3 minutes. Next the film was removed. The film was then solvent exchanged by which 20–30 mL of a 5% (by vol.) mixture of methyltriacetoxysilane in 3-pentanone were spun on the film at 250 rpm's for 20 seconds without allowing the film to dry. The films were then spun dry at 1000 rpm for 5 seconds. The films were baked at elevated temperatures for 1 min. each at 175° C. and 320° C. in air. The film was then placed in a high temperature hotplate that had been pre-equilibrated to 450° C. The film was then processed in the following manner: The high temperature hotplate was opened and the wafer was placed on ceramic pins. The hotplate was closed such that that it was air tight. Nitrogen was flowed at 30 l/min. for thirty seconds to ensure that most of the oxygen in the hotplate had been removed. The wafer was dropped from the pins and heated for 5 minutes. The wafer was then lifted back on the pins and removed. The film was characterized by ellipsometry to determine the refractive indicex and thickness. In addition, the infrared spectra (IR) of the film was measured and compared to the post bake condition to ensure most of the water had been removed.

TABLE 3

Characterization Results of high temperature hotplates 450° C. 5 min.

|  | Post Bake | Post High Temp H.P. Cure |
|---|---|---|
| Thickness (A) | 7201.2 | 7073.1 |
| Refractive index | 1.155 | 1.152 |
| Peak Area (3200–3565 cm-1) | 0.977 | .7064 |

EXAMPLE 28

This example illustrates that the use of a high temperature hotplate set at 450° C. can yield excellent nanoporous silica film quality when fully characterized. The precursor was synthesized by adding 104.0 mL of tetraethoxysilane, 47.0 mL of triethylene glycol monomethyl ether, 8.4 mL of deionized water, and 0.34 mL of 1N nitric acid together in a round bottom flask. The solution was allowed to mix vigorously then heated to ~80° C. and refluxed for 1.5 hours to form a solution. After the solution was allowed to cool, it was diluted 25% by weight with ethanol to reduce the viscosity. The diluted precursor was filtered to 0.1 μm using a teflon filter. Approximately 8.0–10.0 ml of the precursor was deposited onto a 8" inch silicon wafers on a spin chuck, and spun at 2500 rpm for 30 seconds. The film was placed in a flow chamber and gelled and aged using the following conditions: 1) Ammonia gas was bubbled through 15M ammonium hydroxide at a flow rate of 3 liters per minute. The ammonia/ammonium hydroxide was then flowed through the chamber for 3 minutes. Next the film was removed. The film was then solvent exchanged by which 20–30 mL of a 5% (by vol.) mixture of methyltriacetoxysilane in 3-pentanone were spun on the film at 250 rpm's for 20 seconds without allowing the film to dry. The films were then spun dry at 1000 rpm for 5 seconds. The films were baked at elevated temperatures for 1 min. each at 175° C. and 320° C. in air. The film was then placed in a high temperature hotplate that had been pre-equilibrated to 450° C. The film was then processed in the following manner: The high temperature hotplate was opened and the wafer was placed on ceramic pins. The hotplate was closed such that that it was air tight. Nitrogen was flowed at 30 l/min. for thirty seconds to ensure that most of the oxygen in the hotplate had been removed. The wafer was dropped from the pins and heated for 10 minutes. The wafer was then lifted back on the pins and removed. The film was characterized by ellipsometry to determine the refractive indicex and thickness. In addition, the infrared spectra (IR) of the film was measured and compared to the post bake condition to ensure most of the water had been removed.

TABLE 4

Characterization Results of high temperature hotplates 450° C. 10 min.

|  | Post Bake | Post High Temp H.P. Cure |
|---|---|---|
| Thickness (A) | 7201.2 | 7054.8 |
| Refractive index | 1.155 | 1.151 |
| Peak Area (3200–3565 cm-1) | 0.977 | .4468 |

From the foregoing examples it can be seen that a nanoporous dielectric silicon containing composition can be produced by the post deposition steps of exposing a deposited film to water vapor in a sealed chamber evacuated to a pressure below atmospheric pressure followed by exposure to a base vapor.

What is claimed is:

1. A process for curing a dielectric film on a substrate which comprises the step of: treating a suitable substrate comprising a dielectric film, in a substantially oxygen free environment by heating the substrate with a hot plate to a temperature of about 350° C. or greater, for a time period of at least about 5 seconds to about 2 minutes.

2. The process of claim 1 wherein the dielectric film comprises nanoporous silica.

3. The process of claim 1 wherein the substrate comprises at least one semiconductor material.

4. The process of claim 1 wherein the substrate comprises at least semiconductor material selected from the group consisting of gallium arsenide, silicon, compositions containing silicon, germanium and combinations thereof.

5. The process of claim 1 wherein the substrate has a pattern of lines on its surface.

6. The process of claim 1 wherein the substrate has a pattern of lines on its surface wherein the lines comprise a metal, an oxide, a nitride or an oxynitride.

7. The process of claim 1 wherein the substrate has a pattern of lines on its surface wherein the lines comprise a material selected from the group consisting of silica, silicon nitride, titanium nitride, tantalum nitride, aluminum, aluminum alloys, copper, copper alloys, tantalum, tungsten and silicon oxynitride.

8. The process of claim 2 further comprising the subsequent step of treating the nanoporous silica with a surface modification agent under conditions sufficient to render the nanoporous dielectric coating hydrophobic.

9. The process of claim 1, further comprising the step of providing a spin-on dielectric film.

10. The process of claim 1, wherein the dielectric film contains a silicon component.

11. The process of claim 1, wherein the dielectric film provides a dielectric constant of from about 3 or less.

12. A process for curing a nanoporous silica dielectric film on a substrate which comprises the step of:
   treating a suitable substrate comprising a dried nanoporous silica film, in a substantially oxygen free environment by heating the substrate with a hotplate to a temperature of about 350° C. or greater, for a time period of at least about 5 seconds to about 2 minutes.

13. A process for curing a nanoporous silica dielectric film on a substrate which comprises the steps of:
   (a) suspending a suitable substrate with a hotplate, in a substantially oxygen free environment, wherein the substrate remains free of contact with the hotplate, the substrate comprising a dried nanoporous silica film;
   (b) curing the dried nanoporous silica film sufficiently to remove outgassing remnants from the dried nanoporous silica film by heating the substrate with a hotplate to a temperature of about 350° C. or greater, for a time period of at least about 5 seconds to about 2 minutes; then,
   (c) removing the cured, dried suitable substrate from the heating element.

14. A process for curing a nanoporous silica dielectric film on a substrate which comprises the steps of:
   (a) suspending a suitable substrate within a sealable hotplate, wherein the substrate remains free of contact with the hotplate, wherein the substrate comprises a dried nanoporous silica film;
   (b) sealing the hotplate, wherein the suspended substrate is contained therein;
   (c) passing an amount of inert gas across the substrate effective to displace non-inert gases adjacent to the substrate;
   (d) heating the hotplate to a temperature of from about 350° C. to about 600° C. for a time period of at least about 5 seconds to about 2 minutes;
   (e) contacting the substrate with the heated hotplate; and, removing the substrate from the hotplate.

15. The process of claim 14 wherein steps (a) through (e) are conducted in an inert gas environment.

16. A process for curing a nanoporous silica dielectric film on a substrate which comprises the steps of:
   (a) suspending a suitable substrate within a sealable hotplate, wherein the substrate remains free of contact with the hotplate, wherein the substrate comprises a dried nanoporous silica film;
   (b) sealing the hotplate, wherein the suspended substrate is contained therein;
   (c) drawing a vacuum within the hotplate effective to create a substantially oxygen free environment adjacent to the substrate;
   (d) heating the hotplate to a temperature of from about 350° C. to about 600° C.;
   (e) contacting the substrate with the heated hotplate for a time period of at least about 5 seconds to about 2 minutes; and,
   (f) removing the substrate from the hotplate.

17. The process of claim 12 further comprising the subsequent step of treating the nanoporous silica film with a surface modification agent under conditions sufficient to render the nanoporous dielectric coating hydrophobic.

18. The process of claim 13 further comprising the subsequent step of treating the nanoporous silica film with a surface modification agent under conditions sufficient to render the nanoporous dielectric coating hydrophobic.

19. The process of claim 14 further comprising the subsequent step of treating the nanoporous silica film with a surface modification agent under conditions sufficient to render the nanoporous dielectric coating hydrophobic.

20. The process of claim 15 further comprising the subsequent step of treating the nanoporous silica film with a surface modification agent under conditions sufficient to render the nanoporous dielectric coating hydrophobic.

21. The process of claim 16 further comprising the subsequent step of treating the nanoporous silica film with a surface modification agent under conditions sufficient to render the nanoporous dielectric coating hydrophobic.

* * * * *